United States Patent
Shani et al.

(10) Patent No.: US 10,901,847 B2
(45) Date of Patent: Jan. 26, 2021

(54) MAINTAINING LOGICAL TO PHYSICAL ADDRESS MAPPING DURING IN PLACE SECTOR REBUILD

(71) Applicant: EMC IP Holding Company LLC, Hopkinton, MA (US)

(72) Inventors: Nimrod Shani, Raanana (IL); Anton Kucherov, Dudley, MA (US); Lior Kamran, Rishon LeZion (IL); Leron Fliess, Kiryat Ono (IL)

(73) Assignee: EMC IP Holding Company LLC, Hopkinton, MA (US)

(*) Notice: Subject to any disclaimer, the term of this patent is extended or adjusted under 35 U.S.C. 154(b) by 171 days.

(21) Appl. No.: 16/050,530

(22) Filed: Jul. 31, 2018

(65) Prior Publication Data
US 2020/0042387 A1 Feb. 6, 2020

(51) Int. Cl.
*G06F 11/00* (2006.01)
*G06F 11/10* (2006.01)
(Continued)

(52) U.S. Cl.
CPC .......... *G06F 11/1092* (2013.01); *G06F 3/061* (2013.01); *G06F 3/064* (2013.01);
(Continued)

(58) Field of Classification Search
CPC ............. G06F 11/1076; G06F 11/1469; G06F 11/2094; G06F 11/1451; G06F 11/1464; G06F 11/1092; G06F 11/3034
See application file for complete search history.

(56) References Cited

U.S. PATENT DOCUMENTS 7,281,160 B2 * 10/2007 Stewart ............... G06F 11/2087
714/6.13
7,444,464 B2 10/2008 Urmston et al.
(Continued)

FOREIGN PATENT DOCUMENTS

WO 2016111954 A1 7/2016

OTHER PUBLICATIONS

EMC Corporation, "Introduction to the EMC XtremIO Storage Array (Ver. 4.0): A Detailed Review," White Paper, Apr. 2015, 65 pages.
(Continued)

*Primary Examiner* — Elmira Mehrmanesh
(74) *Attorney, Agent, or Firm* — Ryan, Mason & Lewis, LLP

(57) ABSTRACT

An apparatus comprises at least one processing device comprising a processor coupled to a memory that is configured to initiate a read data request utilizing a logical address of a content addressable storage system that maps to a physical address comprising an offset on a storage device that internally maps the offset to a first sector. The processing device is also configured to determine a health of the first sector responsive to the read data request failing, to recover data stored in the first sector responsive to the first sector being a bad sector, and to overwrite the recovered data to the logical address while maintaining the mapping to the physical address by directing a write of the recovered data to the offset to update the internal mapping of the offset in the storage device to a new physical location corresponding to a second sector different than the first sector.

18 Claims, 7 Drawing Sheets

(51) Int. Cl.
*G06F 12/02* (2006.01)
*G06F 3/06* (2006.01)
*G11C 29/52* (2006.01)

(52) U.S. Cl.
CPC .......... *G06F 3/065* (2013.01); *G06F 3/0608* (2013.01); *G06F 3/0619* (2013.01); *G06F 3/0679* (2013.01); *G06F 3/0689* (2013.01); *G06F 12/0246* (2013.01); *G11C 29/52* (2013.01); *G06F 2212/214* (2013.01); *G06F 2212/7201* (2013.01)

(56) References Cited

U.S. PATENT DOCUMENTS

| | | | | |
|---|---|---|---|---|
| 7,653,832 | B2* | 1/2010 | Faibish | G06F 3/0622 |
| | | | | 714/6.11 |
| 8,095,726 | B1 | 1/2012 | O'Connell et al. | |
| 8,214,612 | B1 | 7/2012 | Natanzon | |
| 9,104,326 | B2 | 8/2015 | Frank et al. | |
| 9,208,162 | B1 | 12/2015 | Hallak et al. | |
| 9,286,003 | B1 | 3/2016 | Hallak et al. | |
| 9,552,258 | B2 | 1/2017 | Hallak et al. | |
| 9,600,184 | B2* | 3/2017 | Flynn | G06F 3/061 |
| 9,606,870 | B1 | 3/2017 | Meiri et al. | |
| 9,716,754 | B2 | 7/2017 | Swift | |
| 9,804,922 | B2* | 10/2017 | Kochar | G06F 12/0246 |
| 10,437,501 | B1* | 10/2019 | Kucherov | G06F 3/0683 |
| 10,496,482 | B1* | 12/2019 | Foley | G06F 11/1092 |
| 2008/0279462 | A1 | 11/2008 | Celi, Jr. | |
| 2009/0132955 | A1 | 5/2009 | Garg et al. | |
| 2010/0037091 | A1* | 2/2010 | Baderdinni | G06F 11/1076 |
| | | | | 714/6.12 |
| 2010/0161883 | A1* | 6/2010 | Kurashige | G06F 3/0619 |
| | | | | 711/103 |
| 2010/0179941 | A1 | 7/2010 | Agrawal et al. | |
| 2013/0325824 | A1 | 12/2013 | Shoens | |
| 2014/0181016 | A1 | 6/2014 | Whitehead et al. | |
| 2014/0372697 | A1* | 12/2014 | Pereira | G06F 11/1088 |
| | | | | 711/114 |
| 2015/0169408 | A1* | 6/2015 | Hallak | G06F 11/1092 |
| | | | | 714/770 |
| 2015/0269025 | A1* | 9/2015 | Krishnamurthy | G06F 11/1092 |
| | | | | 714/6.24 |
| 2015/0331806 | A1* | 11/2015 | Mondal | G06F 12/0246 |
| | | | | 711/103 |
| 2016/0150012 | A1 | 5/2016 | Barszczak et al. | |
| 2016/0170987 | A1 | 6/2016 | Kesselman | |
| 2016/0202927 | A1 | 7/2016 | Klarakis et al. | |
| 2016/0224259 | A1 | 8/2016 | Ahrens et al. | |
| 2017/0192857 | A1 | 7/2017 | Meiri et al. | |
| 2017/0300393 | A1* | 10/2017 | Sreedhar M | G06F 11/1658 |
| 2018/0046546 | A1* | 2/2018 | Qiu | G06F 11/106 |

OTHER PUBLICATIONS

EMC Corporation, "Unstoppable Data Reduction: Always-on, In-Line, Zero-Penalty, Enterprise-Class, Free,"https://store.emc.com/xtremio, Jul. 2014, 2 pages.

EMC Corporation, "Introduction to XtremIO Virtual Copies," White Paper, Mar. 2016, 39 pages.

EMC Corporation, "XtremIO Data Production (XDP): Flash-Specific Data Protection, Provided by XtremIO (Ver. 4.0)," White Paper, Apr. 2015, 25 pages.

Dell EMC, "XtremIO v6.0 Specifications," Specification Sheet, 2017, 4 pages.

Dell EMC, "Dell EMC XtremIO X2: Next-Generation All-Flash Array," Data Sheet, 2017, 5 pages.

EMC Corporation, "High Availability, Data Protection and Data Integrity in the XtremIO Architecture," White Paper, Apr. 2015, 28 pages.

Y. Zhang et al., "End-to-End Integrity for File Systems: A ZFS Case Study," Proceedings of the 8th USENIX Conference on File and Storage Technologies (FAST), Feb. 23-26, 2010, 14 pages.

Dell EMC, "Introduction to Dell EMC XtremIO X2 Storage Array—A Detailed Review," Dell EMC White Paper, Aug. 2017, 46 pages.

N. Tolia et al., "Opportunistic Use of Content Addressable Storage for Distributed File Systems," Proceedings of the USENIX Annual Technical Conference, Jun. 9-14, 2003, 14 pages.

EMC Corporation, "EMC Recoverpoint Replication of XtremIO: Understanding the Essentials of RecoverPoint Snap-Based Replication for XtremIO," EMC White Paper, Aug. 2015, 31 pages.

Dell EMC, "Introduction to Dell EMC XtremIO X2 Storage Array—A Detailed Review," Dell EMC White Paper, Apr. 2018, 52 pages.

Dell EMC, "Introduction to XtremIO Metadata-Aware Replication," Dell EMC White Paper, Apr. 2018, 18 pages.

\* cited by examiner

MAINTAINING LOGICAL TO PHYSICAL ADDRESS MAPPING DURING IN PLACE SECTOR REBUILD

FIELD

The field relates generally to information processing systems, and more particularly to storage in information processing systems.

BACKGROUND

In many information processing systems, storage systems are key components. Storage systems, such as block based storage systems, are designed to store and retrieve large amounts of data. To store a block of data, a data block address and data block content are provided. The data block address is also used to retrieve the data block content stored at the specified address. Some storage solutions rely on address-based mapping of data, as well as address-based functionality of a storage system's internal algorithms. This is natural, since computing applications typically rely on address-based mapping and identification of data that is stored and retrieved. However, another solution in which data, internally within a storage system, is mapped and managed based on its content instead of its address can provide various substantial advantages. For example, such a content based storage solution improves storage capacity efficiency since any duplicate block data will only occupy actual capacity of a single instance of that block. As another example, the content based storage solution can improve performance since duplicate block writes do not need to be executed internally in the storage system. Content based storage solutions, however, face various challenges.

SUMMARY

Illustrative embodiments provide techniques for maintaining logical to physical address mapping during in place sector rebuild, such as in performing rebuilds in content addressable storage systems. Such arrangements can considerably reduce the amounts of storage system computational resources that are required for implementing rebuilds or other recovery from sector failure, thereby leading to improved storage system performance.

In one embodiment, an apparatus comprises at least one processing device comprising a processor coupled to a memory. The processing device is configured to initiate a read data request utilizing a given logical address of a content addressable storage system, the given logical address mapping to a given physical address comprising a designated physical address offset on a given storage device of the content addressable storage system, the given storage device internally mapping the designated physical address offset to a first sector. The processing device is also configured to determine a health of the first sector responsive to the read data request failing and to recover data stored in the first sector responsive to the determined health indicating that the first sector is a bad sector. The processing device is further configured to overwrite the recovered data to the given logical address while maintaining the mapping of the given logical address to the given physical address in the content addressable storage system by directing a write of the recovered data to the designated physical address offset to update the internal mapping of the designated physical address offset in the given storage device to a new physical location corresponding to a second sector different than the first sector.

These and other illustrative embodiments include, without limitation, apparatus, systems, methods and processor-readable storage media.

DETAILED DESCRIPTION

Illustrative embodiments will be described herein with reference to exemplary information processing systems and associated computers, servers, storage devices and other processing devices. It is to be appreciated, however, that these and other embodiments are not restricted to the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other cloud-based system that includes one or more clouds hosting multiple tenants that share cloud resources. Numerous different types of enterprise computing and storage systems are also encompassed by the term "information processing system" as that term is broadly used herein.

Figure 1:
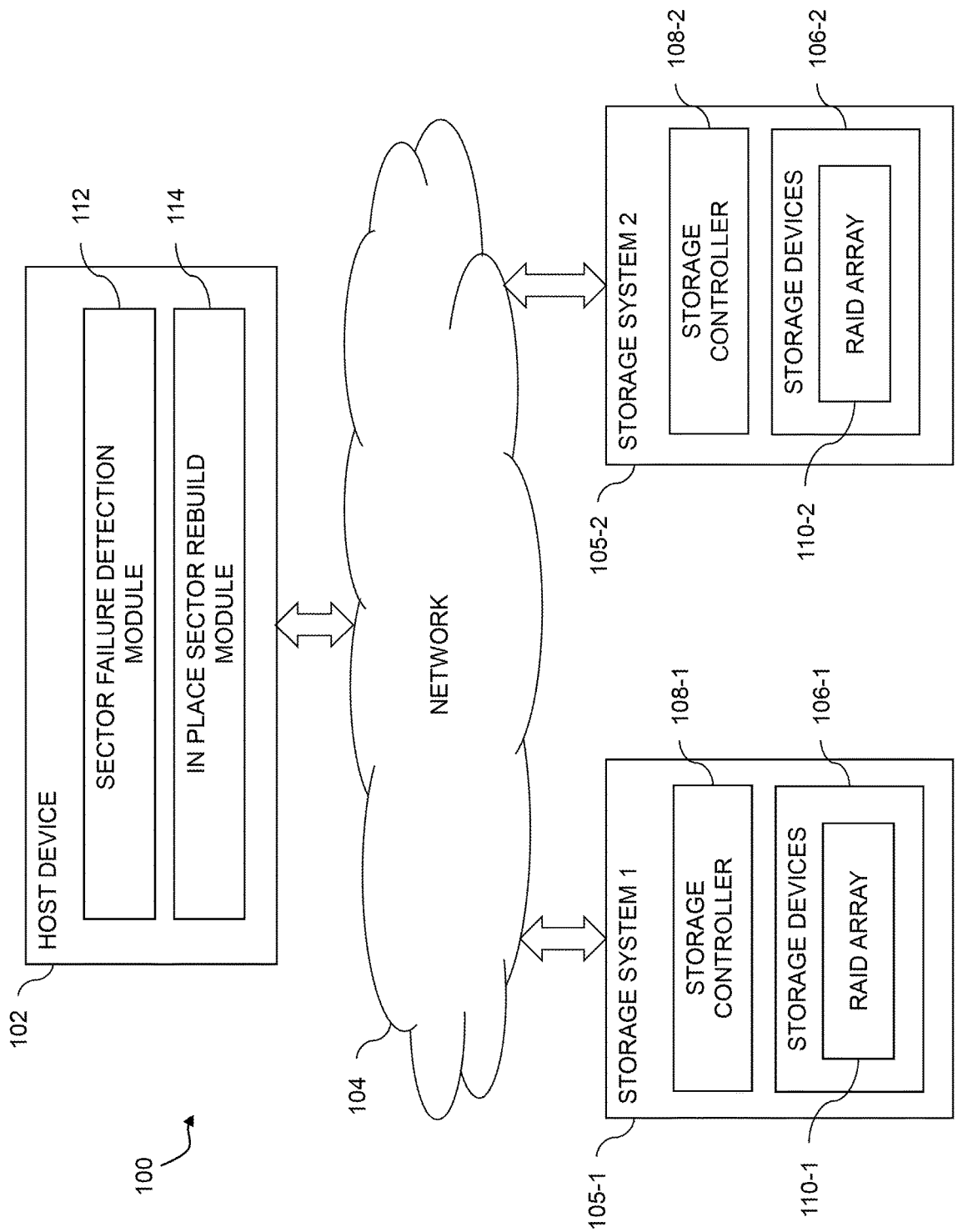
FIG. 1 is a block diagram of an information processing system comprising a host device configured with functionality for maintaining logical to physical address mapping during in place sector rebuild in an illustrative embodiment.

FIG. 1 shows an information processing system 100 configured in accordance with an illustrative embodiment. The information processing system 100 comprises a host device 102, which may comprise one of a plurality of host devices of a computer system. The host device 102 communicates over a network 104 with first and second storage systems 105-1 and 105-2, also denoted as Storage System 1 and Storage System 2, respectively. The storage systems 105-1 and 105-2 are collectively referred to herein as storage systems 105. The host device 102 and storage systems 105 may be part of an enterprise computing and storage system, a cloud-based system or another type of system.

The host device 102 and storage systems 105 illustratively comprise respective processing devices of one or more processing platforms. For example, the host device 102 and the storage systems 105 can each comprise one or more processing devices each having a processor and a memory, possibly implementing virtual machines and/or containers, although numerous other configurations are possible.

The host device 102 and the storage systems 105 can additionally or alternatively be part of cloud infrastructure such as an Amazon Web Services (AWS) system. Other examples of cloud-based systems that can be used to provide one or more of host device 102 and storage systems 105 include Google Cloud Platform (GCP) and Microsoft Azure.

The host device 102 is configured to write data to and read data from the storage systems 105. The host device 102 and the storage systems 105 may be implemented on a common processing platform, or on separate processing platforms. A wide variety of other types of host devices can be used in other embodiments.

The host device 102 in some embodiments illustratively provides compute services such as execution of one or more applications on behalf of each of one or more users associated with the host device 102.

The term "user" herein is intended to be broadly construed so as to encompass numerous arrangements of human, hardware, software or firmware entities, as well as combinations of such entities. Compute and/or storage services may be provided for users under a platform-as-a-service (PaaS) model, although it is to be appreciated that numerous other cloud infrastructure arrangements could be used. Also, illustrative embodiments can be implemented outside of the cloud infrastructure context, as in the case of a stand-alone computing and storage system implemented within a given enterprise.

The network 104 is assumed to comprise a portion of a global computer network such as the Internet, although other types of networks can be part of the network 104, including a wide area network (WAN), a local area network (LAN), a satellite network, a telephone or cable network, a cellular network, a wireless network such as a WiFi or WiMAX network, or various portions or combinations of these and other types of networks. The network 104 in some embodiments therefore comprises combinations of multiple different types of networks each comprising processing devices configured to communicate using Internet Protocol (IP) or other communication protocols.

As a more particular example, some embodiments may utilize one or more high-speed local networks in which associated processing devices communicate with one another utilizing Peripheral Component Interconnect express (PCIe) cards of those devices, and networking protocols such as InfiniBand, Gigabit Ethernet or Fibre Channel. Numerous alternative networking arrangements are possible in a given embodiment, as will be appreciated by those skilled in the art.

The storage systems 105 are accessible to the host device over the network 104. The storage system 105-1 comprises a plurality of storage devices 106-1 and an associated storage controller 108-1. Similarly, the storage system 105-2 comprises a plurality of storage devices 106-2 and an associated storage controller 108-2. The storage devices 106-1 and 106-2 are collectively referred to herein as storage devices 106. The storage controllers 108-1 and 108-2 are collectively referred to as storage controllers 108.

The storage devices 106 illustratively comprise solid state drives (SSDs). Such SSDs are implemented using non-volatile memory (NVM) devices such as flash memory. Other types of NVM devices that can be used to implement at least a portion of the storage devices 106 include non-volatile random access memory (NVRAM), phase-change RAM (PC-RAM) and magnetic RAM (MRAM). These and various combinations of multiple different types of NVM devices may also be used.

However, it is to be appreciated that other types of storage devices can be used in other embodiments. For example, a given storage system as the term is broadly used herein can include a combination of different types of storage devices, as in the case of a multi-tier storage system comprising a flash-based fast tier and a disk-based capacity tier. In such an embodiment, each of the fast tier and the capacity tier of the multi-tier storage system comprises a plurality of storage devices with different types of storage devices being used in different ones of the storage tiers. For example, the fast tier may comprise flash drives while the capacity tier comprises hard disk drives. The particular storage devices used in a given storage tier may be varied in other embodiments, and multiple distinct storage device types may be used within a single storage tier. The term "storage device" as used herein is intended to be broadly construed, so as to encompass, for example, flash drives, solid state drives, hard disk drives, hybrid drives or other types of storage devices.

In some embodiments, at least one of the storage systems 105 illustratively comprises a scale-out all-flash content addressable storage array such as an XtremIO™ storage array from Dell EMC of Hopkinton, Mass. Other types of storage arrays, including by way of example VNX® and Symmetrix VMAX® storage arrays also from Dell EMC, can be used to implement one or both of storage systems 105 in other embodiments.

The term "storage system" as used herein is therefore intended to be broadly construed, and should not be viewed as being limited to content addressable storage systems or flash-based storage systems. A given storage system as the term is broadly used herein can comprise, for example, network-attached storage (NAS), storage area networks (SANs), direct-attached storage (DAS) and distributed DAS, as well as combinations of these and other storage types, including software-defined storage.

Other particular types of storage products that can be used in implementing storage systems 105 in illustrative embodiments include all-flash and hybrid flash storage arrays such as Unity™, software-defined storage products such as ScaleIO™ and ViPR®, cloud storage products such as Elastic Cloud Storage (ECS), object-based storage products such as Atmos®, and scale-out NAS clusters comprising Isilon® platform nodes and associated accelerators, all from Dell EMC. Combinations of multiple ones of these and other storage products can also be used in implementing a given storage system in an illustrative embodiment.

In the FIG. 1 embodiment, the storage devices 106 implement one or more Redundant Array of Independent Disks (RAID) arrays, denoted as RAID array 110-1 for storage devices 106-1 of storage system 105-1 and RAID array 110-2 for storage devices 106-2 of storage system 105-2. The RAID arrays 110-1 and 110-2 may collectively form a single RAID array 110, or may represent distinct RAID arrays. The RAID arrays 110 are assumed to store data in stripes across a plurality of SSDs provided by the storage devices 106. The RAID array 110 is an example of what is more generally referred to herein as data striping across a plurality of storage devices in a storage system.

The host device 102 in the FIG. 1 embodiment includes sector failure detection module 112 and in place sector rebuild module 114, which collectively provide functionality for maintaining logical to physical address mapping during in place sector rebuilds as will be described in further detail below. The host device 102 should also be understood to include additional modules and other components typically found in conventional implementations of computers, servers or other host devices, although such additional modules and other components are omitted from the figure for clarity and simplicity of illustration.

The host device 102 and storage systems 105 in the FIG. 1 embodiment are assumed to be implemented using at least one processing platform each comprising one or more processing devices each having a processor coupled to a memory. Such processing devices can illustratively include particular arrangements of compute, storage and network resources.

The host device 102 and the storage systems 105 may be implemented on respective distinct processing platforms, although numerous other arrangements are possible. For example, in some embodiments at least portions of the host device 102 and one or both of the storage systems 105 are implemented on the same processing platform. The storage systems 105 can therefore be implemented at least in part within at least one processing platform that implements at least a portion of the host device 102.

The term "processing platform" as used herein is intended to be broadly construed so as to encompass, by way of illustration and without limitation, multiple sets of processing devices and associated storage systems that are configured to communicate over one or more networks. For example, distributed implementations of the system 100 are possible, in which certain components of the system reside in one data center in a first geographic location while other components of the system reside in one or more other data centers in one or more other geographic locations that are potentially remote from the first geographic location. Thus, it is possible in some implementations of the system 100 for the host device 102 and storage systems 105 to reside in different data centers. Numerous other distributed implementations of one or both of the host device 102 and the storage systems 105 are possible. Accordingly, the storage systems 105 can also be implemented in a distributed manner across multiple data centers.

Additional examples of processing platforms utilized to implement host devices and/or storage systems in illustrative embodiments will be described in more detail below in conjunction with FIGS. 6 and 7.

It is to be appreciated that these and other features of illustrative embodiments are presented by way of example only, and should not be construed as limiting in any way.

Accordingly, different numbers, types and arrangements of system components such as host device 102, network 104, storage systems 105, storage devices 106, storage controllers 108 and RAID arrays 110 can be used in other embodiments.

It should be understood that the particular sets of modules and other components implemented in the system 100 as illustrated in FIG. 1 are presented by way of example only. In other embodiments, only subsets of these components, or additional or alternative sets of components, may be used, and such components may exhibit alternative functionality and configurations. Additional examples of systems implementing functionality for maintaining logical to physical address mapping during in place sector rebuilds will be described below.

Figure 2:
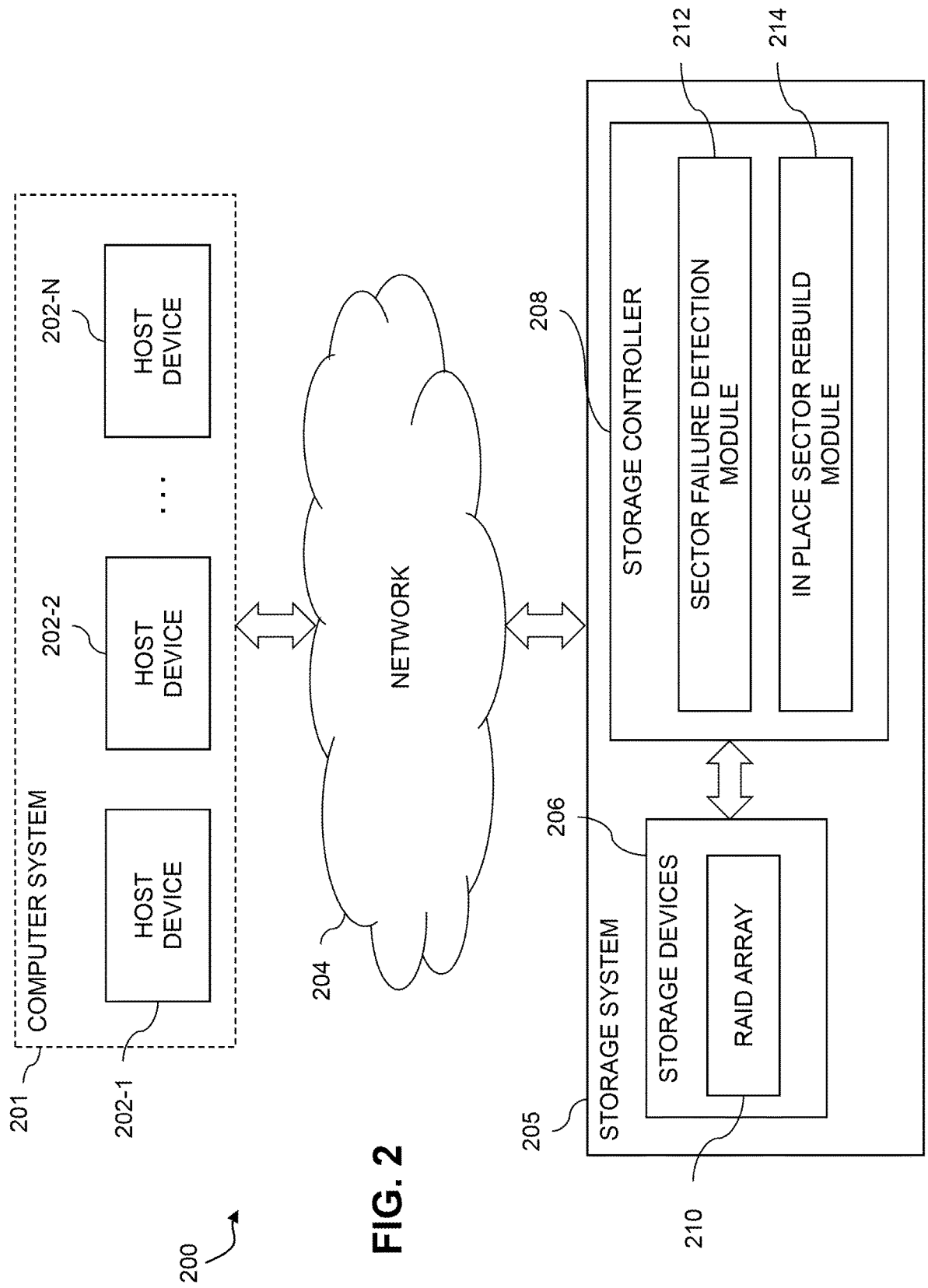
FIG. 2 is a block diagram of an information processing system comprising a storage system configured with functionality for maintaining logical to physical address mapping during in place sector rebuild in an illustrative embodiment.

FIG. 2 shows an information processing system 200 configured in accordance with another illustrative embodiment. The information processing system 200 comprises a computer system 201 that includes host devices 202-1, 202-2, . . . 202-N. The host devices 202 communicate over a network 204 with a storage system 205. The computer system 201 is assumed to comprise an enterprise computer system, cloud-based computer system or other arrangement of multiple compute nodes associated with respective users. The host devices 202 of the computer system 201 in some embodiments illustratively provide compute services such as execution of one or more applications on behalf of each of one or more users associated with respective ones of the host devices 202.

Similar to the storage systems 105 of system 100, the storage system 205 comprises storage devices 206, storage controller 208 and RAID array 210. However, in this embodiment, the functionality for maintaining logical to physical address mapping during in place sector rebuilds is implemented in the storage system 205, rather than in one of the host devices 202. Accordingly, the storage controller 208 in this embodiment comprises modules 212 and 214, which are configured to operate in substantially the same manner as that described above for respective corresponding modules 112 and 114 of the host device 102 in the system 100.

In some embodiments, functionality for maintaining logical to physical address mapping during in place sector rebuilds can be implemented partially in a host device and partially in a storage system. Accordingly, illustrative embodiments are not limited to arrangements in which all such functionality is implemented in a host device or a storage system, and therefore encompass various hybrid arrangements in which the functionality is distributed over one or more host devices and one or more storage systems, each comprising one or more processing devices.

The operation of the information processing systems 100 and 200 will now be described in further detail with reference to the flow diagram of the illustrative embodiment of FIG. 3. The process as shown includes steps 300 through 306, and is suitable for use in systems 100 and 200 but is more generally applicable to other types of information processing systems in which a host device or storage system is configured to maintain metadata during in place sector rebuilds. The steps are illustratively performed at least in part under the control of the sector failure detection module 112 and in place sector rebuild module 114 in host device 102 of system 100 or in modules 212 and 214 in storage controller 208 of system 200.

Figure 3:
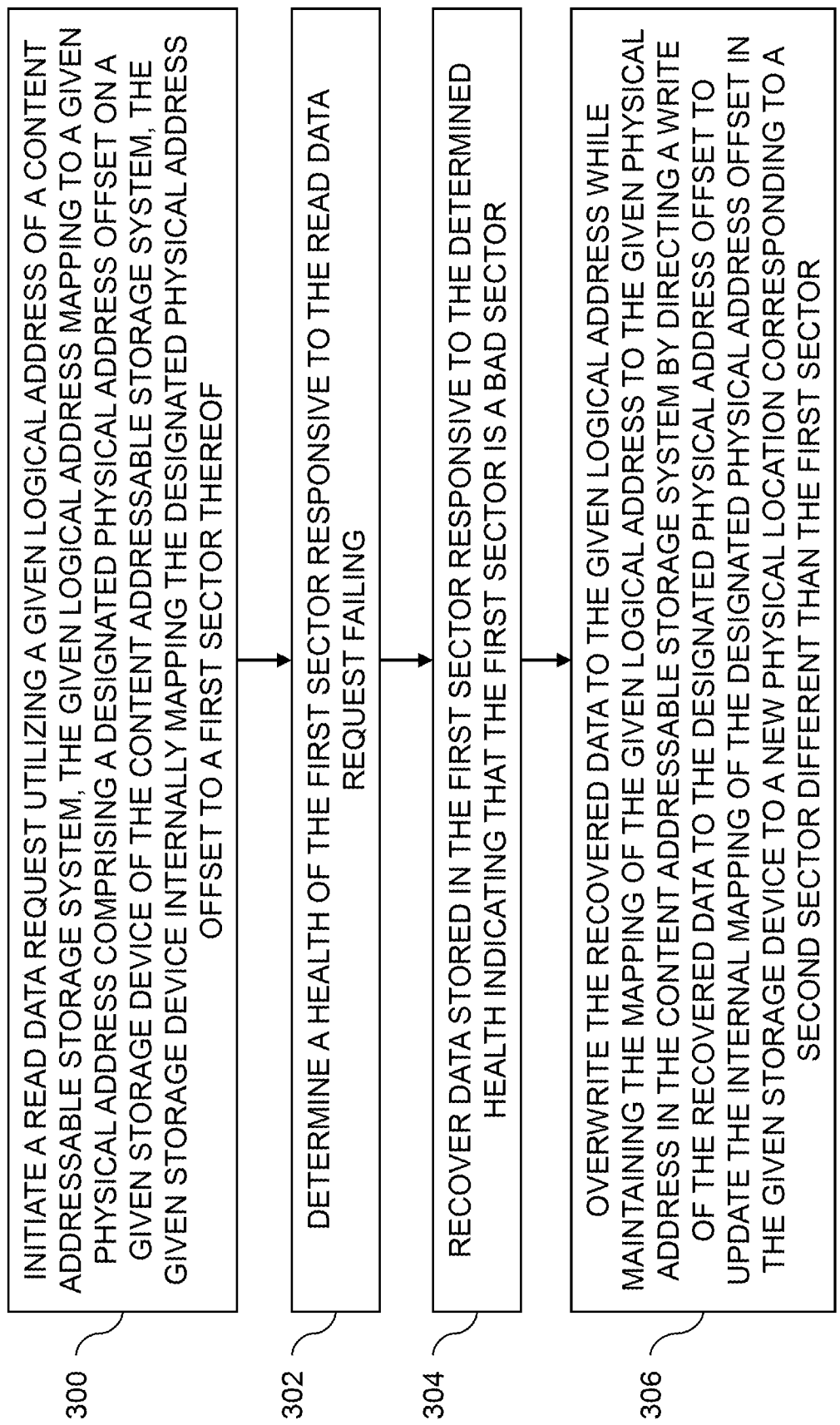
FIG. 3 is a flow diagram of a process for maintaining logical to physical address mapping during in place sector rebuild in an illustrative embodiment.

The FIG. 3 process begins with step 300, initiating a read data request utilizing a given logical address of a content addressable storage system. The given logical address maps to a given physical address, the given physical address comprising a designated physical address offset on a given storage device of the content addressable storage system. The given storage device internally maps the designated physical address offset to a first sector of the given storage device, such as using its firmware. It should be noted that the internal mapping (e.g., of designated physical address offsets to sectors of the given storage device) is not necessarily exposed to the content addressable storage system. In the context of FIG. 3, the term "logical address" refers to the user address (e.g., which may take the form of a volume identifier and offset in a volume), the term "physical address" refers to the offset inside a storage device (e.g., inside a disk) that is used in read and write requests by the content addressable storage system to the storage device (e.g., an SSD), and the term "sector" refers to the actual physical location of the data inside the storage device.

The read data request of step 300 may comprise a user data read request from at least one application running on a host device configured to utilize the content addressable storage system, or a scrubbing mechanism data read for checking a health of the given storage device or the content addressable storage system.

In step 302, a health of the first sector is determined responsive to the read data request initiated in step 300 failing. As mentioned above, the identification of the first sector may not necessarily be exposed by the given storage device to the content addressable storage system (e.g., a storage controller thereof) or other processing device that performs the FIG. 3 process. Thus, step 302 may more generally be viewed as determining the health of the physical address (e.g., the designated physical address offset) as the entity performing the FIG. 3 process may not necessarily be exposed to or aware of the particular sector that the physical address internally maps to within the given storage device.

Data stored in the first sector is recovered in step 304 responsive to the health determination in step 302 indicating that the first sector is a bad sector. The recovered data is then overwritten to the given logical address in step 306. Overwriting the recovered data in step 306 maintains the mapping of the given logical address to the given physical address in the content addressable storage system by directing a write of the recovered data to the designated physical address offset on the given storage device. This causes the given storage device (e.g., the firmware thereof) to update its internal mapping of the designated physical address offset to a new physical location that corresponds to a second sector different than the first sector.

In some embodiments, the mapping of the given logical address to the given physical address comprises a first level of mapping that associates logical addresses of data pages with content-based signatures of the data pages and a second level of mapping that associates the content-based signatures of the data pages with physical storage locations in a plurality of storage devices of the content addressable storage system. Overwriting the recovered data to the given logical address in step 306 advantageously maintains both the first and second levels of mapping, by offloading the responsibility for allocating new areas of disk from the storage system's data path to the given storage device itself.

The content addressable storage system may implement data striping across a plurality of storage devices including the given storage device. Determining the health of the first sector in step 302 may include, responsive to the health determination indicating the first sector is a bad sector, initiating a check of one or more additional sectors on one or more additional storage devices that are in a same stripe as the first sector. This preemptive check may be used to avoid situations in which sectors on multiple disks of storage devices in the same stripe go bad and there is not enough parity to recover from loss on the multiple disks or storage devices. Again, it should be appreciated that the entity performing this processing is not necessarily exposed to the internal mappings of physical address offsets to sectors of the storage devices. Initiating the check of additional sectors may instead refer to initiating of check of other physical address offsets of the target storage devices, which such storage devices internally map to the additional sectors.

The content addressable storage system may comprise a RAID storage system, such as a RAID storage system that includes a prime number k of data disks where a column thereof includes k−1 blocks. The RAID storage system may implement RAID 6, with the number of data disks being k and the number of parity disks being n, where n is greater than one (e.g., where n is 2).

The given storage device may comprise a SSD or other type of storage device which includes firmware or other functionality for allocating new areas of disk in response to requests to write data to a particular physical address offset that corresponds to a bad sector.

In some embodiments, step 302 includes determining whether the given storage device has failed or whether the given storage device is healthy but the first sector has gone bad. If the given storage device has failed, the content addressable storage system may initiate a rebuild of the given storage device by relocating data stored on the given storage device to at least one additional storage device. If the health determination of step 302 indicates that the first sector is a bad sector but the given storage device is otherwise healthy (e.g., has a number of bad sectors below some designated threshold), a check of one or more additional sectors on the given storage device may be initiated. Such additional scanning is not limited to sectors storing data. The additional scanning may include scans of parity sectors and free data sectors so as to determine an overall health of the given storage device.

The particular processing operations and other system functionality described in conjunction with the flow diagram of FIG. 3 are presented by way of illustrative example only, and should not be construed as limiting the scope of the disclosure in any way. Alternative embodiments can use other types of processing operations for maintaining logical to physical address mapping during in place sector rebuilds. For example, the ordering of the process steps may be varied in other embodiments, or certain steps may be performed at least in part concurrently with one another rather than serially. Also, one or more of the process steps may be repeated periodically, or multiple instances of the process can be performed in parallel with one another in order to implement a plurality of different in place sector rebuild processes for respective different storage devices or storage systems within a given information processing system.

Functionality such as that described in conjunction with the flow diagram of FIG. 3 can be implemented at least in part in the form of one or more software programs stored in memory and executed by a processor of a processing device such as a computer or server. As will be described below, a memory or other storage device having executable program code of one or more software programs embodied therein is an example of what is more generally referred to herein as a "processor-readable storage medium."

For example, a host device such as host device 102 or a storage controller such as storage controller 208 that is configured to control performance of one or more steps of the FIG. 3 process in its corresponding system 100 or 200 can be implemented as part of what is more generally referred to herein as a processing platform comprising one or more processing devices each comprising a processor coupled to a memory. A given such processing device may correspond to one or more virtual machines or other types of virtualization infrastructure such as Docker containers or Linux containers (LXCs). The host device 102 of system 100 or the storage controller 208 of system 200, as well as other system components, may be implemented at least in part using processing devices of such processing platforms. For example, in a distributed implementation of the storage controller 208, respective distributed modules of such a storage controller can be implemented in respective containers running on respective ones of the processing devices of a processing platform.

Figure 4:
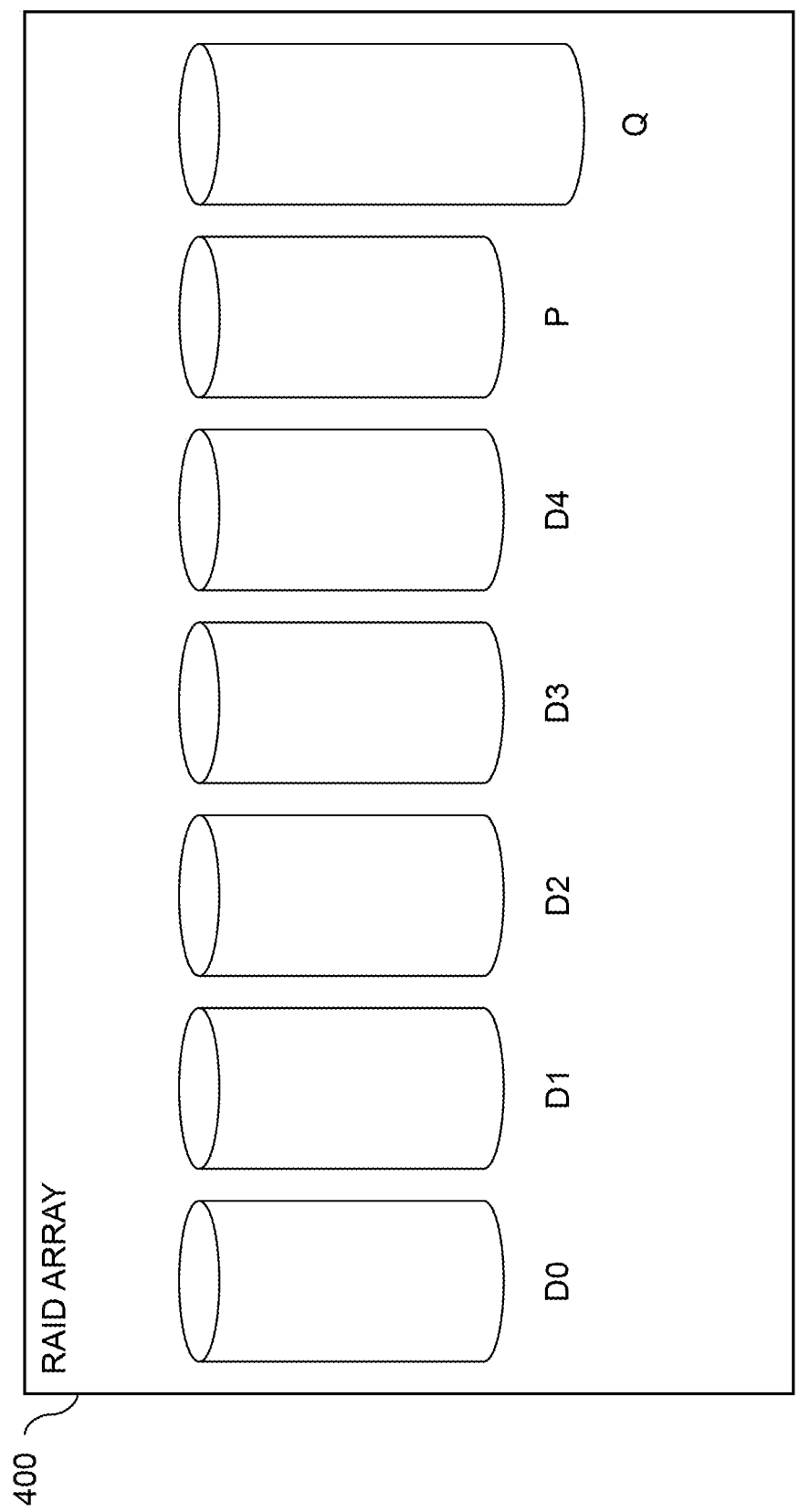
FIG. 4 is a block diagram illustrating a RAID 6 array in an illustrative embodiment.

FIG. 4 shows a RAID array 400, which in this example includes five data disks denoted D0 through D4. A storage controller (e.g., such as storage controllers 108 or storage controller 208) is configured for writing initial data into the array 400, and for updating existing data in the array 400.

The storage controller further provides functionality for recovering data after single or double disk failure.

Each of the disks in the array 400 stores a column of data blocks. The same data block in successive disks forms a row, which is to say the rows cross the disks. The data storage blocks are stored alongside parity data blocks in parity disks denoted P and Q, and the numbers of data blocks in the different columns or disks may be different. Row parity blocks are placed in a row parity column in disk P, and the diagonal parity data is placed in diagonal parity blocks in disk Q.

In the case of five data columns and four data rows, the number of diagonals is one greater than the number of rows. Thus, the diagonal parity column in disk Q includes one more block than the other columns for disks D0 through D4 and the row parity disk P. This is illustrated in FIG. 4 as Q is "taller" than D0 through D4 and P.

The number of data columns is a prime number, and the number of rows is one less than that prime number (e.g., in the FIG. 4 example the prime number is 5 corresponding to the five data disks D0 through D4). It should be noted that, in practice, the various columns are distributed over the available physical disks to avoid system bottlenecks.

Data blocks may be distributed among the data disks in various ways. In one example, there are k data disks, where k=5 is a prime number and there are five data columns corresponding to disks D0 through D4. There are four rows (e.g., k−1). The P column includes the same four rows as the data columns D0 through D4, but the Q column has an extra row.

Each stripe contains k (where k must be prime) data columns D0 through D4, and two parity columns P and Q. The stripe is composed of a quasi-matrix of blocks, which contains k−1 rows. Column P contains k−1 blocks, each providing the parity of the k data disk blocks in its row. The k by k−1 matrix made up of the blocks in the data columns includes k diagonals each of size k−1. Column Q, in contrast with the rest of the columns, contains k blocks and not k−1. Each of the k blocks in disk Q holds the parity of one of the diagonals. It should be noted that the ordering of blocks within each column may be arbitrary. Furthermore, the extra block in column Q may be placed in a data column which does not contain a data block in the diagonal of which this block is the parity. Also, some of the rows may be blank.

In another example, there are k data disks, where k=5 is a prime number and there are five data columns corresponding to disks D0 through D4. There are four rows (e.g., k−1). The P column includes the same four rows as the data columns D0 through D4. The Q column also has four rows, since one of the diagonals in the k by k−1 matrix of the blocks in the data columns is left blank. An equivalent way of providing this effect is by setting one of the diagonals as a virtual diagonal whose content is fixed and equals zero. It should be noted that any number of diagonals may be set as virtual. It is thus a matter of efficient mapping between cells in the stripe and physical disk locations to eliminate further capacity overhead. The only constraint when performing such mappings is that cells in the same column must reside on the same disk, and vice versa.

It should be appreciated that there are various other ways to distribute data blocks in an array such as RAID array 400. For example, in some cases it may be desired to provide more than one row parity column, which results in higher capacity overhead but which allows for a faster rebuild after a single disk failure.

Additional details regarding the above-described techniques for storing data in RAID arrays are disclosed in U.S. Pat. No. 9,552,258, entitled "Method and System for Storing Data in RAID Memory Devices," which is incorporated by reference herein.

When reading the RAID array 400, errors may be encountered when attempting to read certain pages. Persistent or repeated errors when attempting to read a particular page may cause some storage systems to mark an entire disk of the RAID array 400 for rebuild. All data on the disk with that particular page is relocated and the disk is replaced. This, however, may be wasteful when the entire disk is not bad but only a certain sector or sectors thereof have failed (e.g., those sectors storing the page or pages for which read attempts return repeated or persistent error). Thus, only those bad sectors may be marked and the data stored therein may be moved to new locations. In either case, the process results in costly metadata updates for the logical to physical address mapping. As will be described in further detail below with respect to FIG. 5, the storage system implementing a RAID array such as the FIG. 4 RAID array 400 may be a content addressable storage system, and such metadata updates may include updating hash pointers to new physical locations on the disk. The logical address to hash pointers may remain, but the hash pointers to particular physical locations on the disks need to be updated.

Some embodiments permit fixing or recovering from bad sectors in disks without incurring such expensive metadata updates, and thus require fewer data movements. Data for the bad or unreadable sector is recovered, such as using the parity blocks of the RAID array 400, and the data is rewritten to the same offset or physical location on the storage devices of the RAID array 400. The storage devices of the RAID array 400 are assumed to comprise SSDs or other storage devices configured with internal mechanisms for allocating new physical locations for bad sectors. Thus, when the recovered data is rewritten to the same offset, the storage device itself writes the data to a new location using its internal firmware or logic that handles such physical address mapping. As a result, there is no need for the storage controller of the storage system implementing the RAID array 400 to update any hash pointers to the data, since from the perspective of the storage system the data is written to the same location. The responsibility for allocating new areas of disk is offloaded from the storage system's data path to the storage devices themselves. The storage devices are assumed to support changes in their internal mapping of physical addresses or offsets when there is an attempt to write to a bad sector. The storage device thus allocates new areas of disk for the data.

In some embodiments, responsibility for re-allocating new sectors for data residing on bad disk sectors is moved from the content aware or content addressable storage system providing RAID array 400 to the firmware of the disks or storage devices which make up the RAID array 400. It is assumed that only a small amount of sectors on a particular disk or storage device have gone bad. Once the number of bad sectors on a particular disk or storage device reaches some designated threshold, the entire disk may be marked for rebuild.

When a data read from a given sector fails, the disk health is checked against one or more defined disk health policies. The data read may result from a user data read, or from a scrubbing mechanism read. The scrubbing mechanism read may be part of a data scrubbing process that runs on the RAID array 400 to check for defective blocks before a user or application actually accesses them so as to perform preventative maintenance thereon. If the disk health policy indicates that the disk has failed, a normal RAID rebuild process is initiated where the failed disk is replaced. If the disk health policy indicates that the disk is healthy, a process for initiating an in place rebuild of the given sector is initiated.

For the in place rebuild of the given sector, the parity blocks of the RAID array 400 (e.g., the row parity blocks on disk P and/or the diagonal parity blocks on disk Q) are used to recover the data stored in the given sector. In some embodiments, other sectors on the disks in the same stripe as the given sector are also checked. In other embodiments, a system-wide scan of all sectors on the disk with the given sector is initiated. It should be noted that, in addition to recovering and scanning data sectors, the parity sectors and even free data should also be scanned and recovered.

The recovered data for the given sector is overwritten to the same logical address. The logical to physical address mapping is maintained, and the storage device's internal firmware for managing bad sectors is utilized to write the recovered data to a new physical location. The storage device firmware is assumed to provide functionality for handling bad sectors by writing the recovered data to the new physical location. Storage devices such as SSDs do not require writes to set physical locations as in spinning-disk drives, thus enabling such functionality. Advantageously, the recovered data is written to the same logical location. This provides significant improvements relative to techniques where recovered data is written to a new logical location, which incurs expensive metadata updates as well as updates to parities in the stripe. As the functionality for writing the recovered data to the new physical location is handled by the storage device itself, this does not involve added work as the storage device's firmware is assumed to have built-in functionality for handling writes to known bad sectors.

In some embodiments, the storage system comprises an XtremIO™ storage array or other type of content addressable storage system suitably modified to incorporate techniques for maintaining logical to physical address mapping during in place sector rebuilds as disclosed herein.

An illustrative embodiment of such a content addressable storage system will now be described with reference to FIG. 5. In this embodiment, a content addressable storage system 505 comprises a plurality of storage devices 506 and an associated storage controller 508. The content addressable storage system 505 may be viewed as a particular implementation of the storage system 205, and accordingly is assumed to be coupled to host devices 202 of computer system 201 via network 204 within information processing system 200.

The storage controller 508 in the present embodiment is configured to implement functionality for maintaining logical to physical address mapping during in place sector rebuilds of the type previously described in conjunction with FIGS. 1 through 4.

The storage controller 508 includes RAID array 510 and distributed modules 512 and 514, which are configured to operate in a manner similar to that described above for respective corresponding modules 112, 212 and 114, 214.

Figure 5:
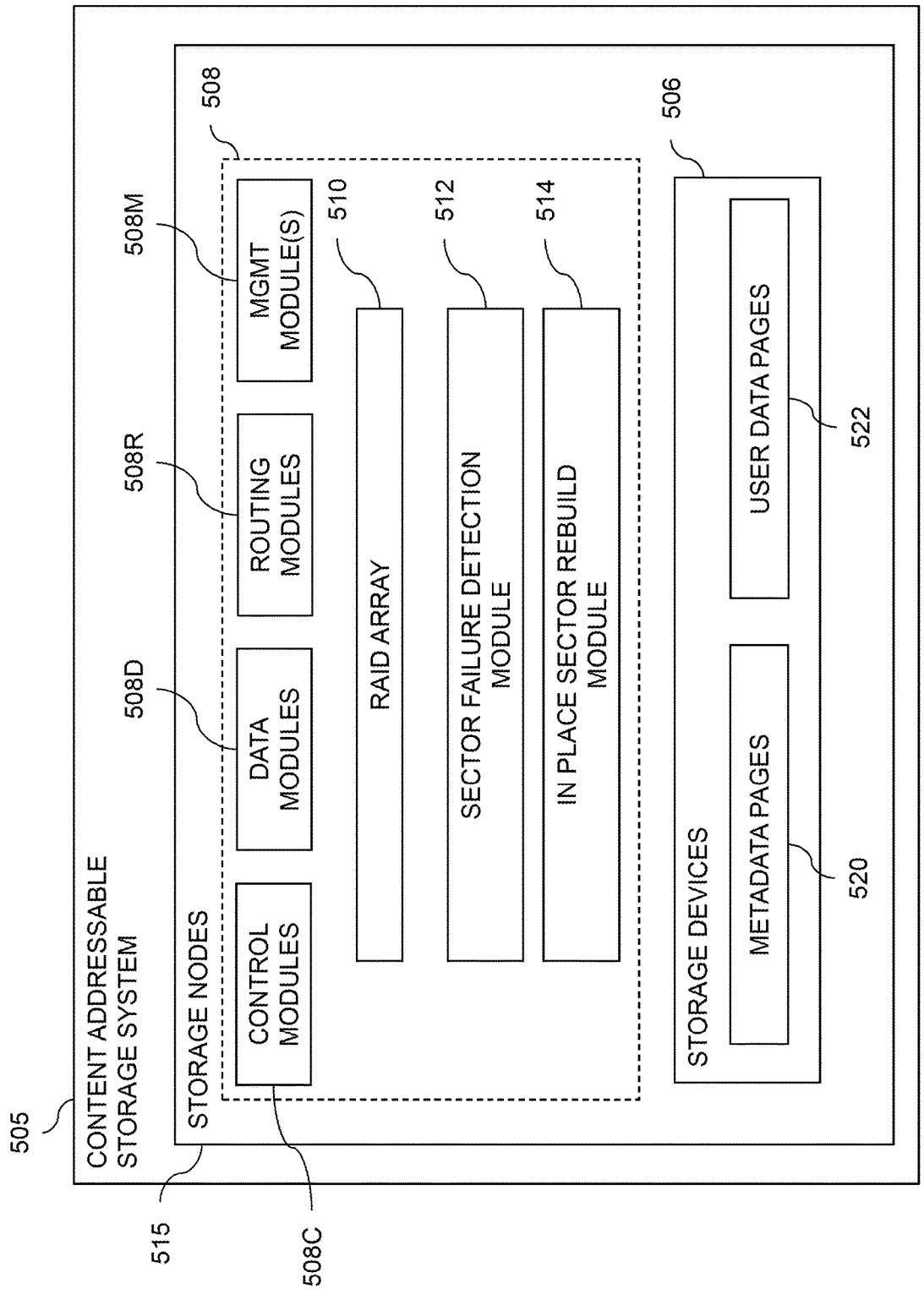
FIG. 5 shows a content addressable storage system having a distributed storage controller configured with functionality for maintaining logical to physical address mapping during in place sector rebuild in an illustrative embodiment.

The content addressable storage system 505 in the FIG. 5 embodiment is implemented as at least a portion of a clustered storage system and includes a plurality of storage nodes 515 each comprising a corresponding subset of the storage devices 506. Other clustered storage system arrangements comprising multiple storage nodes can be used in other embodiments. A given clustered storage system may include not only storage nodes 515 but also additional storage nodes coupled to network 204. Alternatively, such additional storage nodes may be part of another clustered storage system of the system 200. Each of the storage nodes 515 of the storage system 505 is assumed to be implemented using at least one processing device comprising a processor coupled to a memory.

The storage controller 508 of the content addressable storage system 505 is implemented in a distributed manner so as to comprise a plurality of distributed storage controller components implemented on respective ones of the storage nodes 515. The storage controller 508 is therefore an example of what is more generally referred to herein as a "distributed storage controller." In subsequent description herein, the storage controller 508 may be more particularly referred to as a distributed storage controller.

Each of the storage nodes 515 in this embodiment further comprises a set of processing modules configured to communicate over one or more networks with corresponding sets of processing modules on other ones of the storage nodes 515. The sets of processing modules of the storage nodes 515 collectively comprise at least a portion of the distributed storage controller 508 of the content addressable storage system 505.

The modules of the distributed storage controller 508 in the present embodiment more particularly comprise different sets of processing modules implemented on each of the storage nodes 515. The set of processing modules of each of the storage nodes 515 comprises at least a control module 508C, a data module 508D and a routing module 508R. The distributed storage controller 508 further comprises one or more management ("MGMT") modules 508M. For example, only a single one of the storage nodes 515 may include a management module 508M. It is also possible that management modules 508M may be implemented on each of at least a subset of the storage nodes 515.

Each of the storage nodes 515 of the storage system 505 therefore comprises a set of processing modules configured to communicate over one or more networks with corresponding sets of processing modules on other ones of the storage nodes. A given such set of processing modules implemented on a particular storage node illustratively includes at least one control module 508C, at least one data module 508D and at least one routing module 508R, and possibly a management module 508M. These sets of processing modules of the storage nodes collectively comprise at least a portion of the distributed storage controller 508.

Communication links may be established between the various processing modules of the distributed storage controller 508 using well-known communication protocols such as IP and Transmission Control Protocol (TCP). For example, respective sets of IP links used in data transfer and corresponding messaging could be associated with respective different ones of the routing modules 508R.

Although shown as separate modules of the distributed storage controller 508, the modules 512 and 514 in the present embodiment are assumed to be distributed at least in part over at least a subset of the other modules 508C, 508D, 508R and 508M of the storage controller 508. Accordingly, at least portions of the functionality for maintaining logical to physical address mapping during in place sector rebuilds of the modules 512 and 514 may be implemented in one or more of the other modules of the storage controller 508. In other embodiments, the modules 512 and 514 may be implemented as stand-alone modules of the storage controller 508.

The storage devices 506 are configured to store metadata pages 520 and user data pages 522, and may also store additional information not explicitly shown such as checkpoints and write journals. The metadata pages 520 and the user data pages 522 are illustratively stored in respective designated metadata and user data areas of the storage devices 506. Accordingly, metadata pages 520 and user data pages 522 may be viewed as corresponding to respective designated metadata and user data areas of the storage devices 506.

A given "page" as the term is broadly used herein should not be viewed as being limited to any particular range of fixed sizes. In some embodiments, a page size of 8 kilobytes (KB) is used, but this is by way of example only and can be varied in other embodiments. For example, page sizes of 4 KB, 16 KB or other values can be used. Accordingly, illustrative embodiments can utilize any of a wide variety of alternative paging arrangements for organizing the metadata pages 520 and the user data pages 522.

The user data pages 522 are part of a plurality of logical units (LUNs) configured to store files, blocks, objects or other arrangements of data, each also generally referred to herein as a "data item," on behalf of users associated with host devices 202. Each such LUN may comprise particular ones of the above-noted pages of the user data area. The user data stored in the user data pages 522 can include any type of user data that may be utilized in the system 200. The term "user data" herein is therefore also intended to be broadly construed.

The content addressable storage system 505 in the embodiment of FIG. 5 is configured to generate hash metadata providing a mapping between content-based digests of respective ones of the user data pages 522 and corresponding physical locations of those pages in the user data area. Content-based digests generating using hash functions are also referred to herein as "hash digests." Such hash digests or other types of content-based digests are examples of what are more generally referred to herein as "content-based signatures" of the respective user data pages 522. The hash metadata generated by the content addressable storage system 505 is illustratively stored as metadata pages 520 in the metadata area. The generation and storage of the hash metadata is assumed to be performed under the control of the storage controller 508.

Each of the metadata pages 520 characterizes a plurality of the user data pages 522. For example, a given set of user data pages representing a portion of the user data pages 522 illustratively comprises a plurality of user data pages denoted User Data Page 1, User Data Page 2, . . . User Data Page n.

Each of the user data pages 522 in this example is characterized by a LUN identifier, an offset and a content-based signature. The content-based signature is generated as a hash function of content of the corresponding user data page. Illustrative hash functions that may be used to generate the content-based signature include the above-noted SHA1 hash function, or other secure hashing algorithms known to those skilled in the art. The content-based signature is utilized to determine the location of the corresponding user data page within the user data area of the storage devices 506.

Each of the metadata pages 520 in the present embodiment is assumed to have a signature that is not content-based. For example, the metadata page signatures may be generated using hash functions or other signature generation algorithms that do not utilize content of the metadata pages as input to the signature generation algorithm. Also, each of the metadata pages is assumed to characterize a different set of the user data pages.

A given set of metadata pages representing a portion of the metadata pages 520 in an illustrative embodiment comprises metadata pages denoted Metadata Page 1, Metadata Page 2, . . . Metadata Page m, having respective signatures denoted Signature 1, Signature 2, . . . Signature m. Each such metadata page characterizes a different set of n user data pages. For example, the characterizing information in each metadata page can include the LUN identifiers, offsets and content-based signatures for each of the n user data pages that are characterized by that metadata page. It is to be appreciated, however, that the user data and metadata page configurations described above are examples only, and numerous alternative user data and metadata page configurations can be used in other embodiments.

Ownership of a user data logical address space within the content addressable storage system 505 is illustratively distributed among the control modules 508C.

The functionality for maintaining logical to physical address mapping during in place sector rebuilds provided by modules 512 and 514 in this embodiment is assumed to be distributed across multiple distributed processing modules, including at least a subset of the processing modules 508C, 508D, 508R and 508M of the distributed storage controller 508.

For example, the management module 508M of the storage controller 508 may include logic for maintaining logical to physical address mapping during in place sector rebuilds that engages corresponding logic instances in all of the control modules 508C and routing modules 508R in order to implement in place sector rebuild processes described herein.

In some embodiments, the content addressable storage system 505 comprises an XtremIO™ storage array suitably modified to incorporate techniques for in place sector rebuild processes that maintain metadata as disclosed herein.

In arrangements of this type, the control modules 508C, data modules 508D and routing modules 508R of the distributed storage controller 508 illustratively comprise respective C-modules, D-modules and R-modules of the XtremIO™ storage array. The one or more management modules 508M of the distributed storage controller 508 in such arrangements illustratively comprise a system-wide management module ("SYM module") of the XtremIO™ storage array, although other types and arrangements of system-wide management modules can be used in other embodiments. Accordingly, functionality for maintaining logical to physical address mapping during in place sector rebuilds in some embodiments is implemented under the control of at least one system-wide management module of the distributed storage controller 508, utilizing the C-modules, D-modules and R-modules of the XtremIO™ storage array.

In the above-described XtremIO™ storage array example, each user data page has a fixed size such as 8 KB and its content-based signature is a 20-byte signature generated using an SHA1 hash function. Also, each page has a LUN identifier and an offset, and so is characterized by <lun_id, offset, signature>.

The content-based signature in the present example comprises a content-based digest of the corresponding data page. Such a content-based digest is more particularly referred to as a "hash digest" of the corresponding data page, as the content-based signature is illustratively generated by applying a hash function such as SHA1 to the content of that data page. The full hash digest of a given data page is given by the above-noted 20-byte signature. The hash digest may be represented by a corresponding "hash handle," which in some cases may comprise a particular portion of the hash digest. The hash handle illustratively maps on a one-to-one basis to the corresponding full hash digest within a designated cluster boundary or other specified storage resource boundary of a given storage system. In arrangements of this type, the hash handle provides a lightweight mechanism for uniquely identifying the corresponding full hash digest and its associated data page within the specified storage resource boundary. The hash digest and hash handle are both considered examples of "content-based signatures" as that term is broadly used herein.

Examples of techniques for generating and processing hash handles for respective hash digests of respective data pages are disclosed in U.S. Pat. No. 9,208,162, entitled "Generating a Short Hash Handle," and U.S. Pat. No. 9,286,003, entitled "Method and Apparatus for Creating a Short Hash Handle Highly Correlated with a Globally-Unique Hash Signature," both of which are incorporated by reference herein.

As mentioned previously, storage controller components in an XtremIO™ storage array illustratively include C-module, D-module and R-module components. For example, separate instances of such components can be associated with each of a plurality of storage nodes in a clustered storage system implementation.

The distributed storage controller in this example is configured to group consecutive pages into page groups, to arrange the page groups into slices, and to assign the slices to different ones of the C-modules. For example, if there are 1024 slices distributed evenly across the C-modules, and there are a total of 16 C-modules in a given implementation, each of the C-modules "owns" 1024/16=64 slices. In such arrangements, different ones of the slices are assigned to different ones of the control modules 508C such that control of the slices within the storage controller 508 of the storage system 505 is substantially evenly distributed over the control modules 508C of the storage controller 508.

The D-module allows a user to locate a given user data page based on its signature. Each metadata page also has a size of 8 KB and includes multiple instances of the <lun_id, offset, signature> for respective ones of a plurality of the user data pages. Such metadata pages are illustratively generated by the C-module but are accessed using the D-module based on a metadata page signature.

The metadata page signature in this embodiment is a 20-byte signature but is not based on the content of the metadata page. Instead, the metadata page signature is generated based on an 8-byte metadata page identifier that is a function of the LUN identifier and offset information of that metadata page.

If a user wants to read a user data page having a particular LUN identifier and offset, the corresponding metadata page identifier is first determined, then the metadata page signature is computed for the identified metadata page, and then the metadata page is read using the computed signature. In this embodiment, the metadata page signature is more particularly computed using a signature generation algorithm that generates the signature to include a hash of the 8-byte metadata page identifier, one or more ASCII codes for particular predetermined characters, as well as possible additional fields. The last bit of the metadata page signature may always be set to a particular logic value so as to distinguish it from the user data page signature in which the last bit may always be set to the opposite logic value.

The metadata page signature is used to retrieve the metadata page via the D-module. This metadata page will include the <lun_id, offset, signature> for the user data page if the user page exists. The signature of the user data page is then used to retrieve that user data page, also via the D-module.

Write requests processed in the content addressable storage system 505 each illustratively comprise one or more IO operations directing that at least one data item of the storage system 505 be written to in a particular manner. A given write request is illustratively received in the storage system 505 from a host device, illustratively one of the host devices 202. In some embodiments, a write request is received in the distributed storage controller 508 of the storage system 505, and directed from one processing module to another processing module of the distributed storage controller 508. For example, a received write request may be directed from a routing module 508R of the distributed storage controller 508 to a particular control module 508C of the distributed storage controller 508. Other arrangements for receiving and processing write requests from one or more host devices can be used.

The term "write request" as used herein is intended to be broadly construed, so as to encompass one or more IO operations directing that at least one data item of a storage system be written to in a particular manner. A given write request is illustratively received in a storage system from a host device.

In the XtremIO™ context, the C-modules, D-modules and R-modules of the storage nodes 515 communicate with one another over a high-speed internal network such as an InfiniBand network. The C-modules, D-modules and R-modules coordinate with one another to accomplish various IO processing tasks.

The write requests from the host devices identify particular data pages to be written in the storage system 505 by their corresponding logical addresses each comprising a LUN ID and an offset.

As noted above, a given one of the content-based signatures illustratively comprises a hash digest of the corresponding data page, with the hash digest being generated by applying a hash function to the content of that data page. The hash digest may be uniquely represented within a given storage resource boundary by a corresponding hash handle.

The storage system 505 utilizes a two-level mapping process to map logical block addresses to physical block addresses. The first level of mapping uses an address-to-hash ("A2H") table and the second level of mapping uses a hash metadata ("HMD") table, with the A2H and HMD tables corresponding to respective logical and physical layers of the content-based signature mapping within the storage system 505. The HMD table is an example of a hash-to-physical address (H2P) table.

The first level of mapping using the A2H table associates logical addresses of respective data pages with respective content-based signatures of those data pages. This is also referred to logical layer mapping.

The second level of mapping using the HMD table associates respective ones of the content-based signatures with respective physical storage locations in one or more of the storage devices 506. This is also referred to as physical layer mapping. As described elsewhere herein, some embodiments provide techniques for maintaining the logical and physical layer mapping during in place sector rebuilds.

For a given write request, both of the corresponding HMD and A2H tables are updated in conjunction with the processing of that write request.

The A2H and HMD tables described above are examples of what are more generally referred to herein as "mapping tables" of respective first and second distinct types. Other types and arrangements of mapping tables or other content-based signature mapping information may be used in other embodiments.

The logical block addresses or LBAs of a logical layer of the storage system 505 correspond to respective physical blocks of a physical layer of the storage system 505. The user data pages of the logical layer are organized by LBA and have reference via respective content-based signatures to particular physical blocks of the physical layer.

Each of the physical blocks has an associated reference count that is maintained within the storage system 505. The reference count for a given physical block indicates the number of logical blocks that point to that same physical block.

In releasing logical address space in the storage system, a dereferencing operation is generally executed for each of the LBAs being released. More particularly, the reference count of the corresponding physical block is decremented. A reference count of zero indicates that there are no longer any logical blocks that reference the corresponding physical block, and so that physical block can be released.

It should also be understood that the particular arrangement of storage controller processing modules 508C, 508D, 508R and 508M as shown in the FIG. 5 embodiment is presented by way of example only. Numerous alternative arrangements of processing modules of a distributed storage controller may be used to implement functionality for maintaining logical to physical address mapping during in place sector rebuilds in a clustered storage system in other embodiments.

Additional examples of content addressable storage functionality implemented in some embodiments by control modules 508C, data modules 508D, routing modules 508R and management module(s) 508M of distributed storage controller 508 can be found in U.S. Pat. No. 9,104,326, entitled "Scalable Block Data Storage Using Content Addressing," which is incorporated by reference herein. Alternative arrangements of these and other storage node processing modules of a distributed storage controller in a content addressable storage system can be used in other embodiments.

Illustrative embodiments of host devices or storage systems with functionality for maintaining logical to physical address mapping during in place sector rebuilds as disclosed herein can provide a number of significant advantages relative to conventional arrangements.

For example, some embodiments provide techniques for writing recovered data to a same logical address of a storage device, thus avoiding the need for costly metadata updates associated with writing recovered data to new logical locations, which may also incur costly updates to the parities in storage systems that implement data striping across a plurality of storage devices. By writing recovered data to the same logical address as the "bad" sector being recovered, the metadata for the stored data may be maintained. In storage devices which provide random access, such as flash drives or SSDs, the firmware on the SSD manages bad sectors by writing the recovered data to new physical locations. In content addressable storage systems where the recovered data does not need to be written to a different physical location, in place rebuild is thus enabled whereby the logical address to physical address mappings do not need to be changed to recover from bad sectors.

Functionality for maintaining logical to physical address mapping during in place sector rebuilds can be implemented in a host device, in a storage system, or partially in a host device and partially in a storage system.

These and other embodiments can considerably reduce the amounts of computational and memory resources that are required to recover from bad sectors in content addressable storage systems, thus providing associated improvements in system performance.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement host devices and storage with functionality for maintaining logical to physical address mapping during in place sector rebuilds will now be described in greater detail with reference to FIGS. 6 and 7. Although described in the context of system 100, these platforms may also be used to implement at least portions of other information processing systems in other embodiments.

Figure 6:
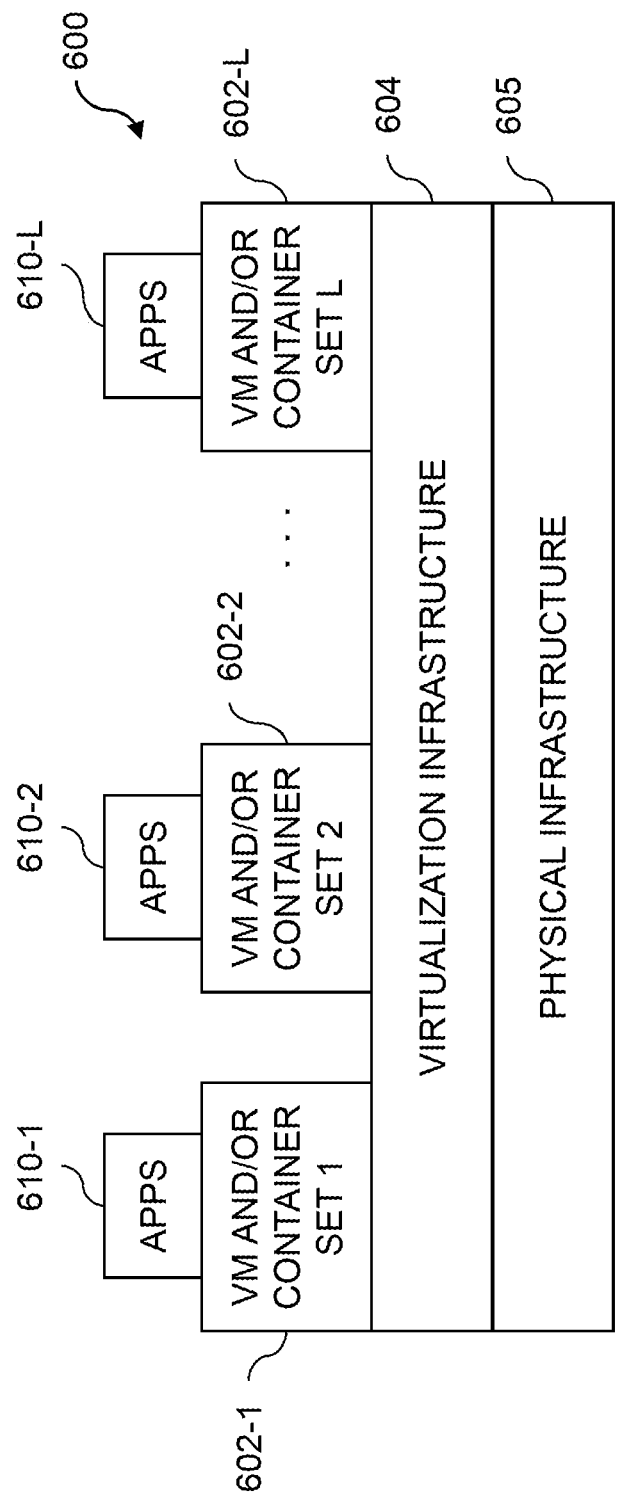
FIGS. 6 and 7 show examples of processing platforms that may be utilized to implement at least a portion of an information processing system in illustrative embodiments.
Figure 7:
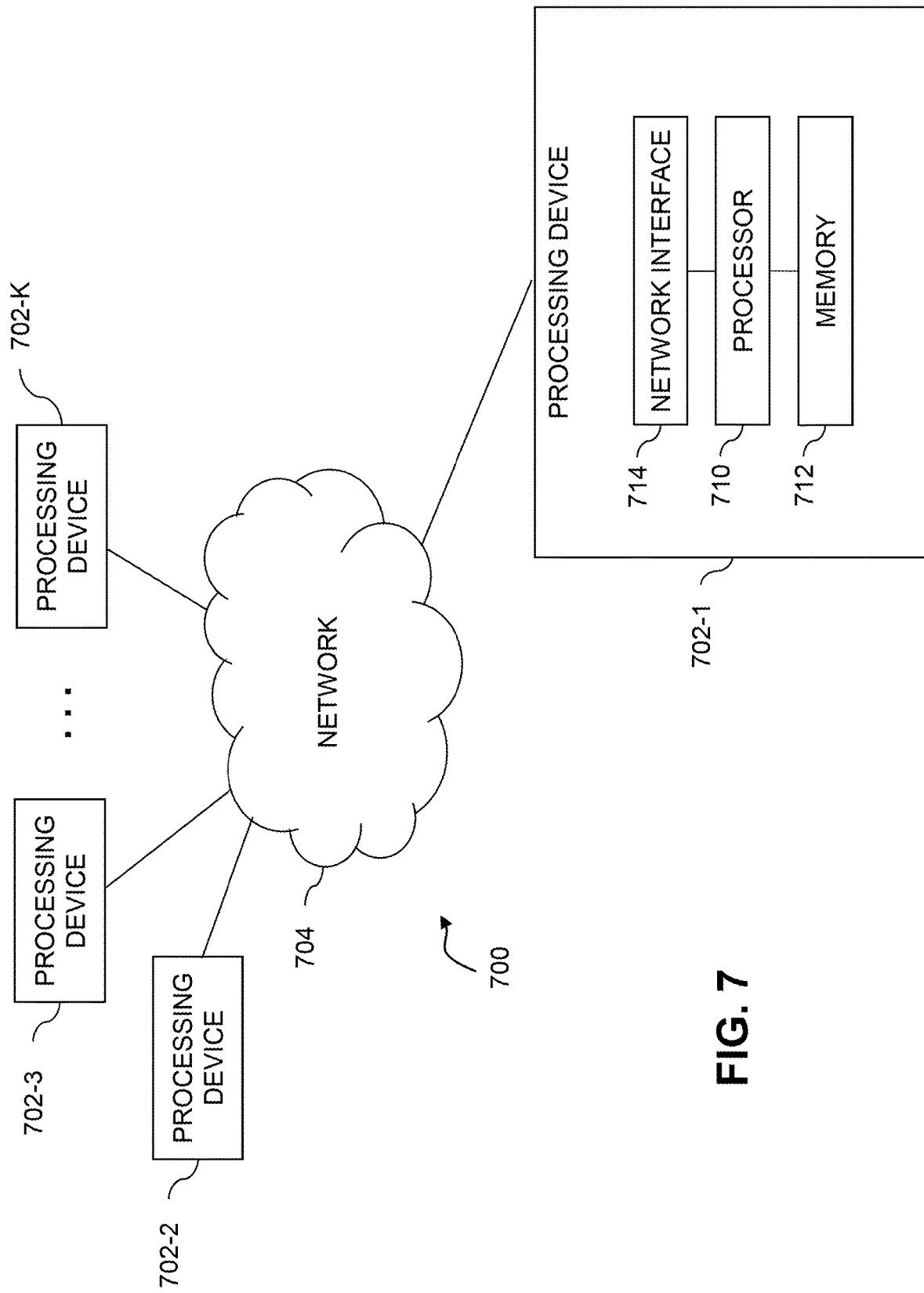

FIG. 6 shows an example processing platform comprising cloud infrastructure 600. The cloud infrastructure 600 comprises a combination of physical and virtual processing resources that may be utilized to implement at least a portion of the information processing system 100. The cloud infrastructure 600 comprises multiple virtual machines (VMs) and/or container sets 602-1, 602-2, . . . 602-L implemented using virtualization infrastructure 604. The virtualization infrastructure 604 runs on physical infrastructure 605, and illustratively comprises one or more hypervisors and/or operating system level virtualization infrastructure. The operating system level virtualization infrastructure illustratively comprises kernel control groups of a Linux operating system or other type of operating system.

The cloud infrastructure 600 further comprises sets of applications 610-1, 610-2, . . . 610-L running on respective ones of the VMs/container sets 602-1, 602-2, . . . 602-L under the control of the virtualization infrastructure 604. The VMs/container sets 602 may comprise respective VMs, respective sets of one or more containers, or respective sets of one or more containers running in VMs.

In some implementations of the FIG. 6 embodiment, the VMs/container sets 602 comprise respective VMs implemented using virtualization infrastructure 604 that comprises at least one hypervisor. Such implementations can provide functionality for maintaining logical to physical address mapping during in place sector rebuilds of the type described above for one or more processes running on a given one of the VMs. For example, each of the VMs can implement such functionality for one or more processes running on that particular VM.

An example of a hypervisor platform that may be used to implement a hypervisor within the virtualization infrastructure 604 is the VMware® vSphere® which may have an associated virtual infrastructure management system such as the VMware® vCenter™. The underlying physical machines may comprise one or more distributed processing platforms that include one or more storage systems.

In other implementations of the FIG. 6 embodiment, the VMs/container sets 602 comprise respective containers implemented using virtualization infrastructure 604 that provides operating system level virtualization functionality, such as support for Docker containers running on bare metal hosts, or Docker containers running on VMs. The containers are illustratively implemented using respective kernel control groups of the operating system. Such implementations can provide functionality for maintaining logical to physical address mapping during in place sector rebuilds of the type described above for one or more processes running on different ones of the containers. For example, a container host device supporting multiple containers of one or more container sets can implement one or more instances of such logic or functionality.

As is apparent from the above, one or more of the processing modules or other components of system 100 may each run on a computer, server, storage device or other processing platform element. A given such element may be viewed as an example of what is more generally referred to herein as a "processing device." The cloud infrastructure 600 shown in FIG. 6 may represent at least a portion of one processing platform. Another example of such a processing platform is processing platform 700 shown in FIG. 7.

The processing platform 700 in this embodiment comprises a portion of system 100 and includes a plurality of processing devices, denoted 702-1, 702-2, 702-3, . . . 702-K, which communicate with one another over a network 704.

The network 704 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 702-1 in the processing platform 700 comprises a processor 710 coupled to a memory 712.

The processor 710 may comprise a microprocessor, a microcontroller, an application-specific integrated circuit (ASIC), a field-programmable gate array (FPGA) or other type of processing circuitry, as well as portions or combinations of such circuitry elements.

The memory 712 may comprise random access memory (RAM), read-only memory (ROM), flash memory or other types of memory, in any combination. The memory 712 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 702-1 is network interface circuitry 714, which is used to interface the processing device with the network 704 and other system components, and may comprise conventional transceivers.

The other processing devices 702 of the processing platform 700 are assumed to be configured in a manner similar to that shown for processing device 702-1 in the figure.

Again, the particular processing platform 700 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure such as VxRail™, VxRack™, VxRack™ FLEX, VxBlock™, or Vblock® converged infrastructure from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for maintaining logical to physical address mapping during in place sector rebuilds of a host device or storage system as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, host devices, storage systems, storage nodes, storage devices, storage controllers, and associated functionality for maintaining logical to physical address mapping during in place sector rebuilds, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
   at least one processing device comprising a processor coupled to a memory;
   the processing device being configured:
   to initiate a read data request utilizing a given logical address of a content addressable storage system, the given logical address mapping to a given physical address comprising a designated physical address offset on a given storage device of the content addressable storage system, the given storage device internally mapping the designated physical address offset to a first sector of the given storage device;
   to determine a health of the first sector of the given storage device responsive to the read data request failing;
   to recover data stored in the first sector of the given storage device responsive to the determined health indicating that the first sector of the given storage device is a bad sector; and
   to overwrite the recovered data to the given logical address while maintaining the mapping of the given logical address to the given physical address in the content addressable storage system by directing a write of the recovered data to the designated physical address offset to update the internal mapping of the designated physical address offset in the given storage device to a new physical location corresponding to a second sector of the given storage device different than the first sector of the given storage device, wherein the content addressable storage system implements data striping across a plurality of storage devices including the given storage device, and wherein the at least one processing device is further configured, responsive to the determined health of the first sector of the given storage device indicating that the first sector of the given storage device is a bad sector, initiating a check of one or more additional sectors on one or more additional storage devices in a same stripe as the first sector of the given storage device.

2. The apparatus of claim 1 wherein the mapping of the given logical address to the given physical address comprises a first level of mapping that associates logical addresses of data pages with content-based signatures of the data pages and a second level of mapping that associates the content-based signatures of the data pages with physical storage locations in a plurality of storage devices of the content addressable storage system.

3. The apparatus of claim 2 wherein overwriting the recovered data to the given logical address maintains the first and second levels of mapping.

4. The apparatus of claim 1 wherein the content addressable storage system comprises a Redundant Array of Independent Disks (RAID) storage system.

5. The apparatus of claim 4 wherein a number of data disks in the RAID storage system comprises a prime number k, and wherein a column of the RAID storage system comprises k–1 blocks.

6. The apparatus of claim 4 wherein the RAID storage system implements RAID 6 with the number of data disks being k and the number of parity disks being n, where n is greater than one.

7. The apparatus of claim 1 wherein the given storage device comprises a solid state drive (SSD).

8. The apparatus of claim 1 wherein determining the health of the first sector of the given storage device comprises determining whether the given storage device has failed or whether the given storage device is healthy but the first sector of the given storage device has gone bad.

9. The apparatus of claim 8 wherein the processing device is further configured, responsive to determining that the given storage device has failed, to initiate a rebuild of the given storage device by relocating data stored on the given storage device to at least one additional storage device.

10. The apparatus of claim 1 wherein the at least one processing device is further configured, responsive to the determined health of the first sector of the given storage device indicating that the first sector of the given storage device is a bad sector, initiating a check of one or more additional sectors on the given storage device.

11. The apparatus of claim 1 wherein the read data request comprises a user data read request from at least one application running on a host device configured to utilize the content addressable storage system.

12. The apparatus of claim 1 wherein the read data request comprises a scrubbing mechanism data read for checking a health of the given storage device.

13. A method comprising:

initiating a read data request utilizing a given logical address of a content addressable storage system, the given logical address mapping to a given physical address comprising a designated physical address offset on a given storage device of the content addressable storage system, the given storage device internally mapping the designated physical address offset to a first sector of the given storage device;

determining a health of the first sector of the given storage device responsive to the read data request failing;

recovering data stored in the first sector of the given storage device responsive to the determined health indicating that the first sector of the given storage device is a bad sector; and overwriting the recovered data to the given logical address while maintaining the mapping of the given logical address to the given physical address in the content addressable storage system by directing a write of the recovered data to the designated physical address offset to update the internal mapping of the designated physical address offset in the given storage device to a new physical location corresponding to a second sector of the given storage device different than the first sector of the given storage device;

wherein the method is implemented by at least one processing device comprising a processor coupled to a memory, wherein the content addressable storage system implements data striping across a plurality of storage devices including the given storage device, and further comprising, responsive to the determined health of the first sector of the given storage device indicating that the first sector of the given storage device is a bad sector, initiating a check of one or more additional sectors on one or more additional storage devices in a same stripe as the first sector of the given storage device.

14. The method of claim 13 wherein the mapping of the given logical address to the given physical address comprises a first level of mapping that associates logical addresses of data pages with content-based signatures of the data pages and a second level of mapping that associates the content-based signatures of the data pages with physical storage locations in a plurality of storage devices of the content addressable storage system.

15. The method of claim 14 wherein overwriting the recovered data to the given logical address maintains the first and second levels of mapping.

16. A computer program product comprising a non-transitory processor-readable storage medium having stored therein program code of one or more software programs, wherein the program code when executed by at least one processing device causes said at least one processing device:

to initiate a read data request utilizing a given logical address of a content addressable storage system, the given logical address mapping to a given physical address comprising a designated physical address offset on a given storage device of the content addressable storage system, the given storage device internally mapping the designated physical address offset to a first sector of the given storage device;

to determine a health of the first sector of the given storage device responsive to the read data request failing;

to recover data stored in the first sector of the given storage device responsive to the determined health indicating that the first sector of the given storage device is a bad sector; and to overwrite the recovered data to the given logical address while maintaining the mapping of the given logical address to the given physical address in the content addressable storage system by directing a write of the recovered data to the designated physical address offset to update the internal mapping of the designated physical address offset in the given storage device to a new physical location corresponding to a second sector of the given storage device different than the first sector of the given storage device, wherein the content addressable storage system implements data striping across a plurality of storage devices including the given storage device, and wherein the program code when executed by said at least one processing device further causes said at least one processing device, responsive to the determined health of the first sector of the given storage device indicating that the first sector of the given storage device is a bad sector, to initiate a check of one or more additional sectors on one or more additional storage devices in a same stripe as the first sector of the given storage device.

17. The computer program product of claim 16 wherein the mapping of the given logical address to the given physical address comprises a first level of mapping that associates logical addresses of data pages with content-based signatures of the data pages and a second level of mapping that associates the content-based signatures of the data pages with physical storage locations in a plurality of storage devices of the content addressable storage system.

18. The computer program product of claim 17 wherein overwriting the recovered data to the given logical address maintains the first and second levels of mapping.

* * * * *